(12) United States Patent
Fredrickson et al.

(10) Patent No.: US 6,317,856 B1
(45) Date of Patent: Nov. 13, 2001

(54) ENCODER AND A METHOD OF ENCODING FOR PARTIAL RESPONSE CHANNELS

(75) Inventors: Lisa Fredrickson, Seattle, WA (US); Peter Gillen, Dublin (IE)

(73) Assignee: Seagate Technology LLC, Scotts Valley, CA (US)

( * ) Notice: Subject to any disclaimer, the term of this patent is extended or adjusted under 35 U.S.C. 154(b) by 0 days.

(21) Appl. No.: 09/271,566

(22) Filed: Mar. 18, 1999

Related U.S. Application Data

(60) Provisional application No. 60/078,552, filed on Mar. 19, 1998.

(51) Int. Cl.[7] ............................ H03M 13/00; H03M 13/03
(52) U.S. Cl. ............................................. 714/755; 714/794
(58) Field of Search .................................... 714/755, 752, 714/758, 786, 795, 794, 799, 800, 802; 341/59, 81, 61, 95

(56) References Cited

U.S. PATENT DOCUMENTS

| | | | |
|---|---|---|---|
| 5,341,386 | 8/1994 | Shimoda et al. | 371/43 |
| 5,451,943 | 9/1995 | Satomura | 341/58 |
| 5,502,735 | 3/1996 | Cooper | 371/43 |
| 5,537,112 | 7/1996 | Tsang | 341/59 |
| 5,576,707 | 11/1996 | Zook | 341/58 |
| 5,635,933 * | 6/1997 | Fitzpatrick et al. | 341/58 |
| 6,072,410 * | 6/2000 | Kim | 341/81 |
| 6,130,629 * | 10/2000 | Aziz et al. | 341/50 |

OTHER PUBLICATIONS

B. Brickner and J. Moon, "A High–Dimensional Signal Space Implementation of FDTS/DF", *IEEE Transactions on Magnetics*, Sep. 1996, pp. 3941–3943.

B. Brickner and J. Moon, "Maximum Transition Run Codes for Data Storage Systems", *IEEE Transaction on Magnetics*, Sep.1996, pp. 3941–3943.

* cited by examiner

*Primary Examiner*—Christine T. Tu
(74) *Attorney, Agent, or Firm*—Westman, Champlin & Kelly, P.A.

(57) ABSTRACT

An encoder and a method of encoding successive data words into successive code words for transmission through a channel is provided. The encoder maps a first portion of each successive data word unchanged into a first portion of a corresponding one of the successive code words and maps a second portion of each successive data word into a second portion of a corresponding one of the code words according to a selected code. The successive code words are concatenated to form an encoded bit stream having a plurality of bit positions. The selected code imposes a run length constraint on the successive code words such that the encoded bit stream has a maximum possible run of ten consecutive binary zeroes in adjacent ones of the plurality of bit positions and imposes an interleave constraint on the selected code words such that the encoded bit stream has a maximum possible run of ten consecutive binary zeroes in every other one of the plurality of bit positions.

11 Claims, 4 Drawing Sheets

ENCODER AND A METHOD OF ENCODING FOR PARTIAL RESPONSE CHANNELS

CROSS-REFERENCE TO CO-PENDING APPLICATION

This application claims the benefit of U.S. Provisional Patent Application No. 60/078,552, entitled "RATE 16/17 (G/I)=(10/10) CODE FOR PARTIAL RESPONSE CHANNELS," filed on Mar. 19, 1998.

BACKGROUND OF THE INVENTION

The present invention relates to digital communications systems and, more particularly to an encoding and decoding system in a disc drive or other data storage system.

In the field of digital communication systems, digital information is conveyed from a transmitter to a receiver through a channel. "Channel" is a generalized term that can include many different mediums such as recording media, telephonic lines and electromagnetic spectrum. In data storage systems, such as magnetic disc drives, the channel includes a storage medium, and the digital information is transmitted to the storage medium and stored for some period of time before being recovered and delivered to the receiver.

A typical magnetic disc drive includes one or more rigid discs mounted for rotation on a hub or spindle. Each disc has an associated data head formed of a hydrodynamic bearing and a transducer, for communicating with the surface of the disc. An electromechanical actuator moves the data head radially over the disc surface for track seek operations and holds the transducer directly over a desired track on the disc surface for track following operations. A drive controller controls the disc drive based on commands received from a host system to retrieve information from the discs and to store information on the discs. The drive controller is comprised of various subsystems, typically including a "host interface" for communicating with the host system, a "servo subsystem" for controlling the actuators and a "read channel" for recovering recorded data from the storage medium.

Information is typically stored in concentric data tracks on the disc surface. The direction of current through the transducer is controlled to encode magnetic flux reversals on the surface of the disc within the selected data track. In one type of coding, known as non-return-to-zero-inverse (NRZI) coding, a digital "1" is represented by a magnetic flux reversal from one bit position to the next in the data track, and a digital "0" is represented by a lack of a magnetic flux reversal from one bit position to the next.

In retrieving data from the disc, the servo subsystem controls the electromechanical actuator so that the data head flies above the desired data track, senses the flux reversals stored in the data track, and generates a read signal based on those flux reversals. The read signal is typically conditioned and then decoded by the read channel to recover the data represented by the flux reversals.

All channels, including disc drive storage channels, introduce noise into the signals they convey. To detect and sometimes to correct signal errors caused by this channel noise, a large number of coding techniques have been developed. These coding techniques convert data words formed of a number of data bits into code words formed of a number of code bits Coding constraints imposed in the code words permit the detection and sometimes the correction of errors in the signals received from the channel.

The average ratio of the number of data bits to the number of code bits is known as the code rate of the code. In general, the ability to detect and correct errors in a received signal may be increased as the code rate decreases because a lower code rate means a greater amount of redundant information in the code word. However, each additional bit added by the encoder increases the time and energy needed to transmit the signal through the channel.

Depending on the detection scheme, the code imposes certain constraints on the code word pattern. For example, in a disc drive, the rotational speed of the spindle motor that rotates the magnetic media varies over time. This results in non-uniform time intervals between read signal voltage pulses. A phase locked loop (PLL) is used to lock the phase and frequency of the read timing clock to the phase and frequency of the read signal voltage pulses. To ensure that the PLL is updated regularly, a code can be used that limits the number of consecutive zeroes in the coded sequence to be no greater than a maximum number "g". This constraint on the maximum length of consecutive zeroes in a coded sequence is generally known as a run-length constraint. Smaller values of "g" ensure a greater minimum update rate for timing in the PLL. However, smaller values of "g" produce more constrained codes with a lower achievable code rate.

In a magnetic recording channel that employs Partial Response, Maximum Likelihood (PRML) signaling and uses a Viterbi detector to recover the data, another constraint "i" can also be incorporated in the code to limit delay in the Viterbi algorithm. The "i" constraint in a stream of code words represents the number of consecutive zeroes in each of two bit-wise interleaved sub-sequences of binary digits within the stream. One of the subsequence is formed by taking the odd indexed binary digits of the stream, and the other of the sub-sequences is formed by taking the even indexed binary digits of the stream.

Suppose that the sequence of binary inputs to the channel is labeled $\{c_0, C_1, C_2, \ldots\}$. The compact notation $$c(D) = \sum_{i=0}^{\infty} c_i D^i \qquad \text{Eq. 1}$$

is referred to as the "D-transform" of the input sequence which uses the unit delay operator "D", as it is known in the literature, to express that the coefficient $c_k$ of $D^k$ is the kth input to the channel. Partial response channels for magnetic recording condition the received output of the storage medium so that the sampled response of the system to an isolated input bit is given by a characteristic partial response polynomial, or "channel transfer function", P(D). Partial response channels for magnetic recording often have a partial response polynomial of the form $$P(D)=(1-D)(1+D)^n, \qquad \text{Eq. 2}$$

where n is a positive integer. The D-transform of the noiseless output of the channel, v(D), is given by $$v(D)=c(D)P(D) \qquad \text{Eq. 3}$$

where the product is taken by normal polynomial multiplication.

Because of the (1−D)(1+D) factor of P(D), the channel has an all-zero response to long runs of consecutive same binary input symbols in the even and odd indexed binary sub-sequences and to long runs of consecutive alternating input symbols in the combined, global sequence. These sequences should be avoided because they contain little phase and amplitude information for closed loop control of the read channel.

One method of generating the desired channel input sequences is to use an encoder and a precoder at the input of the data channel. The encoder converts user data words that are to be stored in the channel into code words having selected constraints so that the code words avoid undesirable bit sequences. The precoder further conditions the code words and can have a transfer function of the form, $$H(D) = \frac{1}{1 \oplus D^2} \quad \text{Eq. 4}$$

where "$\oplus$" denotes an exclusive-OR operation. The encoder produces a binary coded sequence b(D) which is input to the precoder. The output of the precoder is the channel input c(D), given by $$c(D) = b(D)H(D) \quad \text{Eq. 5}$$

The conditioned code words are then provided to the channel. When the noisy output of the partial response channel is received, a detector and decoder are used to estimate the original user data. An encoder and a decoder are desired which have a relatively high code rate, satisfy the selected code constraints and require only a small number of elements to implement.

The present invention addresses these and other problems, and offers other advantages over the prior art.

SUMMARY OF THE INVENTION

One aspect of the present invention provides a method of encoding successive data words into successive code words for transmission through a channel. The method includes mapping a first portion of each successive data word unchanged into a first portion of a corresponding one of the successive code words. A second portion of each successive data word is mapped into a second portion of a corresponding one of the code words according to a selected code. The successive code words are concatenated to form an encoded bit stream having a plurality of bit positions. A run length constraint is imposed on the selected code such that encoded stream has a maximum possible run of ten consecutive binary zeroes in adjacent positions of the plurality of bit positions, and an interleave constraint is imposed on the selected code such that the encoded stream has a maximum possible run of ten consecutive binary zeroes in every other one of the plurality of bit positions.

Another aspect of the present invention provides a method of encoding successive 16-bit data words for transmission through a channel. The method includes mapping a first portion of each successive 16-bit data word unchanged into a first portion of a corresponding 17-bit code word and mapping a second portion of each successive 16-bit data word into a second portion of the corresponding 17-bit code word according to a selected code. The corresponding 17-bit code words for the successive 16-bit data words are concatenated to form an encoded bit stream having a plurality of bit positions. A run length constraint is imposed on the selected code such that the encoded stream has a maximum possible run of ten consecutive binary zeroes in adjacent positions of the plurality of bit positions, and an interleave constraint is imposed on the selected code such that encoded stream has a maximum possible run of ten consecutive binary zeroes in every other one of the plurality of bit positions.

Another aspect of the present invention provides an encoder for encoding successive data words into respective, successive code words which are concatenated to form an encoded bit stream. The encoder includes an m-bit data word input, an n-bit code word output and an encoding circuit coupled between the m-bit data word input and the n-bit code word output. The m-bit data word input receives the successive data words. The encoding circuit passes a first portion of each successive data word unchanged to the n-bit code word output as a first portion of a respective one of the successive code words. The encoding circuit passes a second portion of each successive data word to the n-bit code word output as a second portion of the respective successive code word in an encoded form. The encoded form limits the number of consecutive zeroes appearing in the encoded bit stream to a maximum of ten in a sequence of adjacent bit positions within the encoded bit stream and in subsequences of even and odd indexed bit positions in the encoded bit stream sequence.

Yet another aspect of the present invention provides a disc drive storage channel. The storage channel includes a transducer capable of communicating with a data storage disc and an encoder which is coupled to the transducer. The encoder encodes successive data words into successive code words according to a selected code to form an encoded bit stream, which is then precoded and applied the transducer. The encoder imposes a first consecutive same symbol run constraint on a first length of adjacent bit positions in the encoded bit stream and a second consecutive same symbol run constraint on a second length of even indexed bit positions and odd indexed bit positions in the encoded bit stream.

DETAILED DESCRIPTION OF THE PREFERRED EMBODIMENTS

Figure 1:
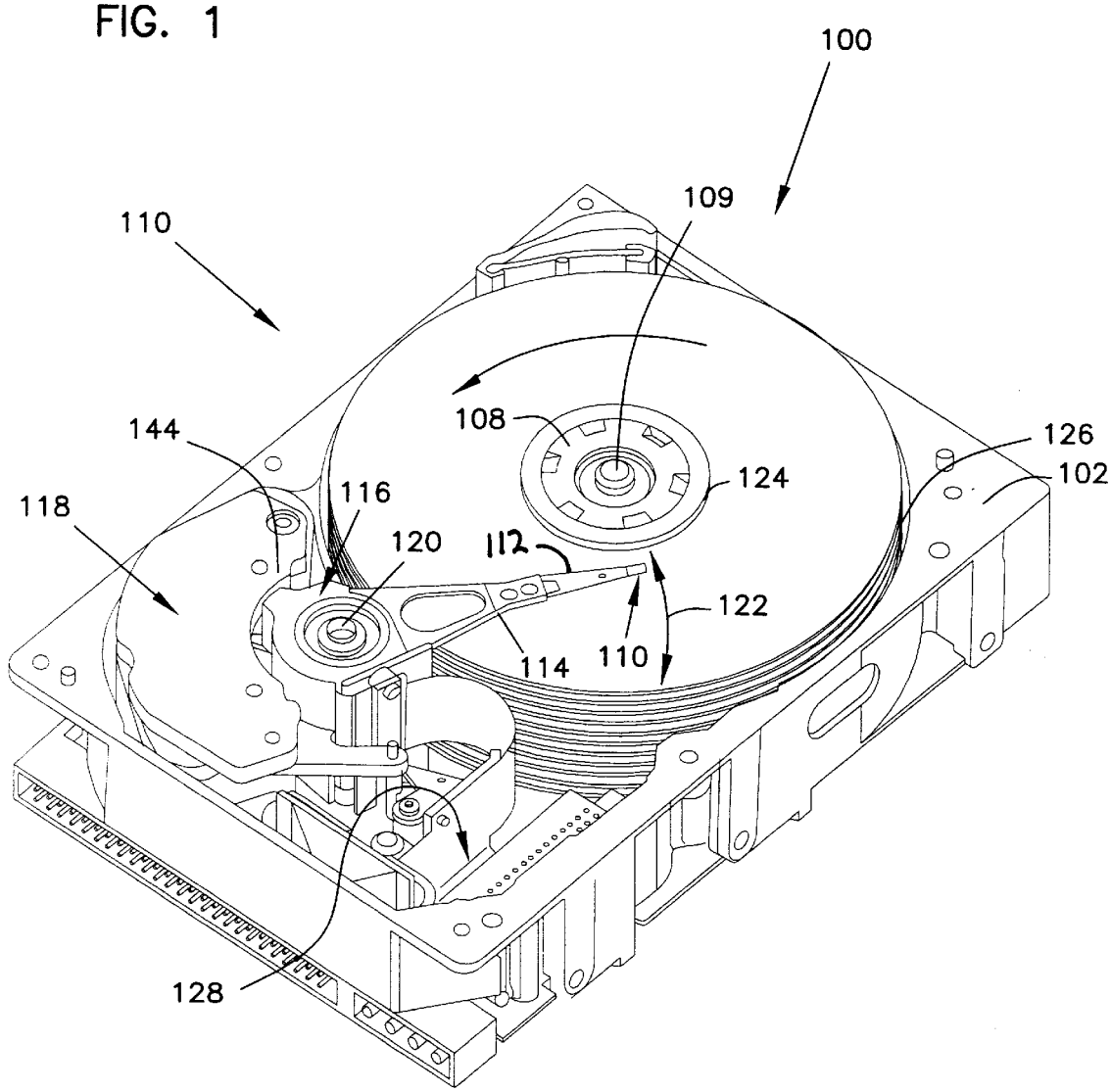
FIG. 1 is a perspective view of a disc drive in which the encoder of the present invention can be used.

FIG. 1 is a perspective view of a disc drive 100 in which the present invention is useful. Disc drive 100 includes a housing with a base 102 and a top cover (not shown). Disc drive 100 further includes a disc pack 106, which is mounted on a spindle motor (not shown) by a disc clamp 108. Disc pack 106 includes a plurality of individual discs which are mounted for co-rotation about central axis 109. Each disc surface has an associated head 110 which is mounted to disc drive 100 for communication with the disc surface. In the example shown in FIG. 1, heads 110 are supported by suspensions 112 which are in turn attached to track accessing arms 114 of an actuator 116. The actuator shown in FIG. 1 is of the type known as a rotary moving coil actuator and includes a voice coil motor (VCM), shown generally at 118. Voice coil motor 118 rotates actuator 116 with its attached heads 110 about a pivot shaft 120 to position heads 110 over a desired data track along a path 122 between a disc inner diameter 124 and a disc outer diameter 126. Voice coil motor operates under control of internal circuitry 128.

Write circuitry within internal circuitry 128 encodes the data to be stored into successive code words and sends the code words in the form of a serial analog write signal to the write transducer on head 110 which encodes magnetic flux reversals within a magnetic layer on the disc surface. During read operations, the read transducer in head 110 senses the magnetic flux reversals and generates a serial analog read signal. The analog read signal is converted into a serial digital signal, which is provided to detector and decoder circuitry within internal circuitry 128 to produce a recovered data signal.

Figure 2:
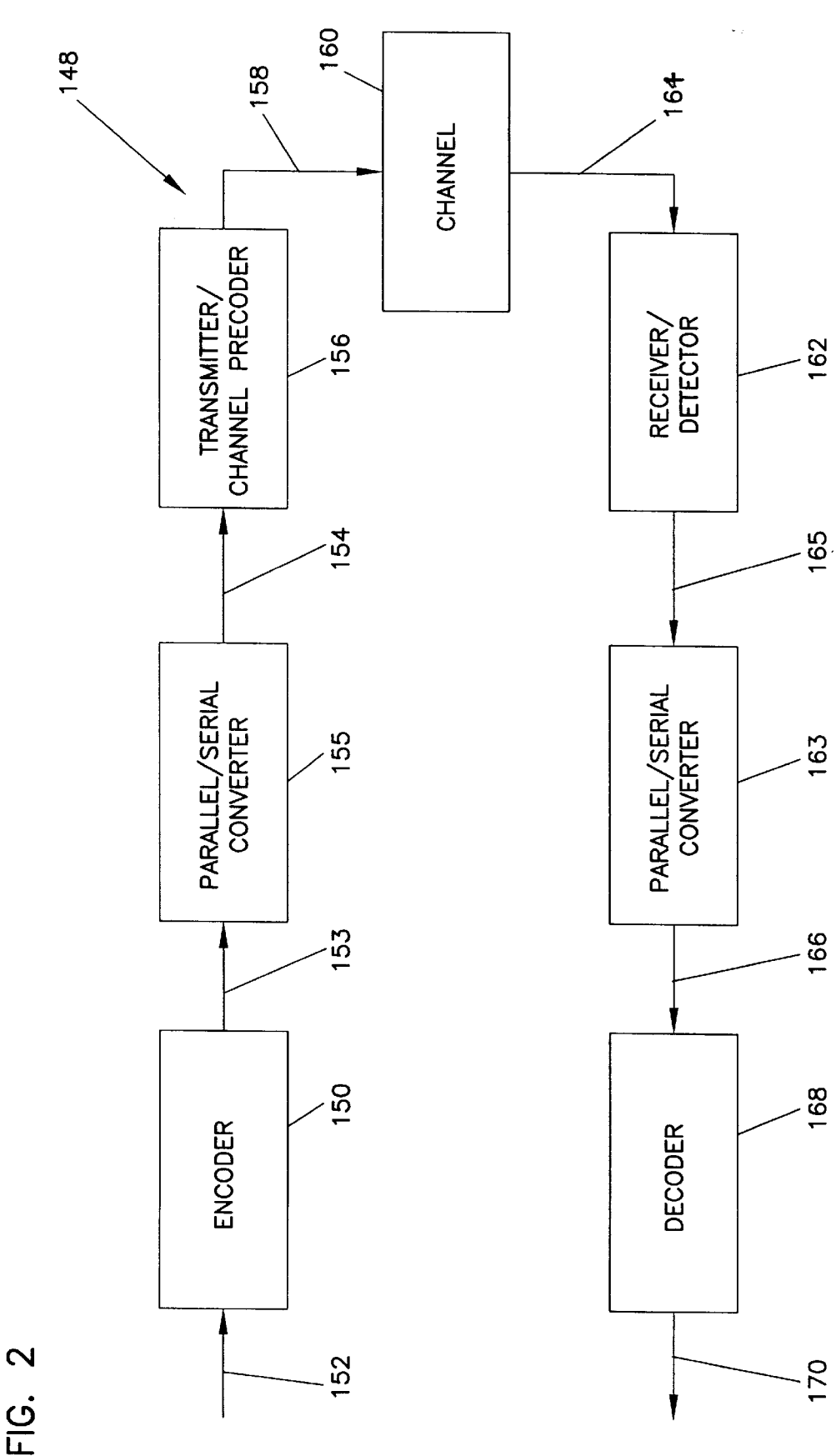
FIG. 2 is a block diagram of an example of a generalized communication system in which the encoder of the present invention can be used.

FIG. 2 is a block diagram of a generalized communication system 148 according to one embodiment of the present invention, which can be formed within disc drive 100, for example. Communication system 148 includes an encoder 150, which receives successive data words 152 and encodes the successive data words into successive code words 153. Each data word can include any number of symbols. In a binary system, for example, each symbol represents one logical data bit. In disc drive applications, common data word lengths are eight or sixteen bits. As described in more detail below, successive data words are encoded into successive code words using a Run length Limited code with "g" and "i" constraints. Encoder 150 includes combinational logic to ensure that code words are produced which avoid undesirable sequences of binary symbols. In alternative embodiments, encoder 150 can be implemented in software with a look-up table for making the conversion between each user data words and its corresponding code word. Other hardware and software implementations can also be used.

Parallel-to-serial converter 155 receives the successive code words 153, converts each code word into a serial representation and concatenates the serial representations to produce a serial stream of the code word bits 154. Precoder 156 receives the serial code word stream 154 and conditions the sequence so that it is optimized for the type of detector used to recover the signal from the channel. In the preferred embodiment, precoder 156 conditions the sequence according to the polynomial given in Equation 4 above. Precoder 156 produces an encoded write signal 158, which is provided to channel 160.

In disc drive 100, channel 160 includes a write current amplifier, the write transducer in head 110, disc pack 106, and the read transducer in head 110. The encoded write signal is stored on the disc surface by the write transducer. During a read operation, the read transducer reads the stored, encoded information from the disc surface and conveys the encoded information to receiver/detector 162 as a read signal 164. Receiver/detector 162 amplifies and filters read signal 164, and then recovers the encoded information from the read signal using one of several known detection methods. For instance, receiver/detector 162 may use a Viterbi detector, Decision Feedback Equalization (DFE), Fixed-Delay Tree Search with Decision Feedback (FDTS/DF) or Reduced State Sequence detection (RSSE). After detecting and amplifying the signal from channel 160, receiver/detector 162 produces a recovered sequence of code word bits 165, which are provided to serial-to-parallel converter 163. The sequence of code word bits 165 is in a serial format at the input to serial-to-parallel converter 163.

Serial-to-parallel converter 163 groups the bits into code words and converts the code words from a serial format to a parallel format. Successively recovered code words 166 have lengths corresponding to the lengths of the code words generated by encoder 150. Serial-to-parallel converter 163 then outputs the successively recovered code words 166 in parallel format to decoder 168. Decoder 168 uses the inverse of the coding rules used by encoder 150 and converts successive code words 166 into respective data words 170.

Encoder 150 imposes several constraints on the bit patterns in code word stream 153. Since the rotational velocity of the disc can vary over time, a phase locked loop (PLL) is used to lock the phase and frequency of the read timing clock to the phase and frequency of read signal 164. To ensure that the PLL is updated regularly, encoder 150 uses a code that limits the number of consecutive zeros in code word stream 153 to no greater than a maximum number "g". This kind of code is known as a Run Length Limited (RLL) code with a global "g" constraint. Encoder 150 also limits the maximum run length of zeros in each of two interleaved sub-sequences within code word stream 153, which are formed by the odd indexed binary digits and the even indexed binary digits, respectively, in code word stream 153. This kind of code constraint is known as an interleaved "i" constraint. In a preferred embodiment, encoder 150 uses a 16/17 rate code with a "g" constraint of ten and an "i" constraint of ten, and these constraints are enforced at all boundaries between adjacent code words.

In an RLL code of rate m/n, m-bit long data words are mapped into n-bit long code words that satisfy the selected RLL constraints, where m and n are positive integer variables. In independent block coding $2^m$ n-bit code word patterns are required to map all the m-bit long data patterns. For example, a 16/17 rate code maps successive 16-bit data words (or two 8-bit data bytes) into successive 17-bit code words. When m and n are large, the encoder can become very complicated.

To overcome these problems, encoder 150 divides each 16-bit user data word 152, which can be referred to as D[15:0], into two 8-bit user data bytes U[7:0] and V[7:0]. The $i^{th}$ pair of user data bytes U[7:0] and V[7:0] that is provided to encoder 150 is denoted, $$\{U^{(i)}[7:0], V^{(i)}[7:0]\} = \{u_7^{(i)}, u_6^{(i)}, u_5^{(i)}, \ldots u_0^{(i)}, v_7^{(i)}, v_6^{(i)}, v_5^{(i)}, \ldots v_0^{(i)}\} \quad \text{Eq. 5}$$

The $i^{th}$ code word produced by encoder 150 is denoted, $$B^{(i)}[16:0] = \{b_{16}^{(i)}, b_{15}^{(i)}, b_{14}^{(i)}, \ldots b_0^{(i)}\} \quad \text{Eq. 6}$$

Figure 3:
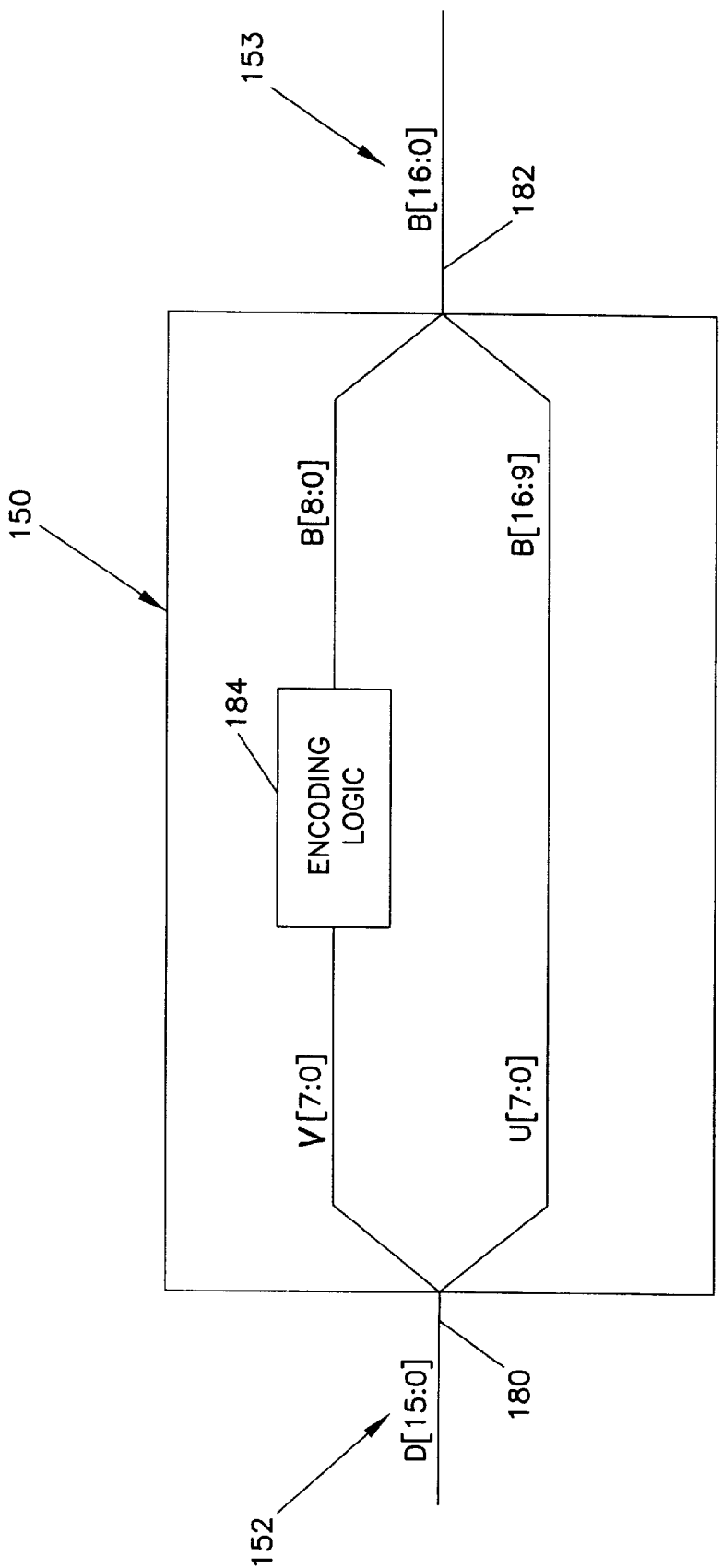
FIG. 3 is a block diagram of the encoder shown in FIG. 2, according to one embodiment of the present invention.

FIG. 3 is a block diagram of encoder 150 according to one embodiment of the present invention. Encoder 150 includes user data word input 180, code word output 182 and combinational encoding logic 184. The successive data words 152, which are each labeled D[15:0], are applied to user data word input 180. Encoder 150 applies the first 8-bit byte U[7:0] of each user data word unchanged to the first eight bits B[16:9] of each code word on code word output 182. The individual bit mapping of these bits is shown in Equation 7, $$b_{16} = u_7, b_{15} = u_6, b_{14} = u_5, b_{13} = u_4, b_{12} = u_3, b_{11} = u_2, b_{10} = u_1,$$
$$\text{and } b_9 = u_0 \quad \text{Eq. 7}$$

The second 8-bit byte V[7:0] of each user data word is applied to the input of encoding logic 184. Logic 184 maps each 8-bit user data byte V[7:0] into a corresponding 9-bit code word pattern B[8:0] while avoiding undesirable bit patterns. This 9-bit code word pattern B[8:0] is applied to the remaining 9 bits of the corresponding code word on code word output 182 to form the overall 17-bit code word pattern B[16:0].

The 9-bit code word patterns produced by logic 184 are selected to satisfy the code constraints for the overall code word stream 153. The constraints are satisfied by selecting only those code words that have the following properties:

i) $\{b_8, b_7\}$ is non-zero (i.e. not a logic "00");

ii) $\{b_1, b_0\}$ is non-zero (i.e. not a logic "00");

iii) $\{b_8, b_6, b_4, b_2\}$ is non-zero (i.e. not a logic "0000");

iv) $\{b_7, b_5, b_3, b_1\}$ is non-zero (i.e. not a logic "0000"); and v) $\{b_6, b_4, b_2, b_0\}$ is non-zero (i.e. not a logic "0000").

Table 1 shows 260 of a possible 512 9-bit sequences that have the above-properties.

TABLE 1

```
010000101 010000110 010000111 010001101 010001110 010001111
010010001 010010010 010010011 010010101 010010110 010010111
010011001 010011010 010011011 010011101 010011110 010011111
010100101 010100110 010100111 010101101 010101110 010101111
010110001 010110010 010110011 010110101 010110110 010110111
010111001 010111010 010111011 010111101 010111110 010111111
011000001 011000010 011000011 011000101 011000110 011000111
011001001 011001010 011001011 011001101 011001110 011001111
011010001 011010010 011010011 011010101 011010110 011010111
011011001 011011010 011011011 011011101 011011110 011011111
011100001 011100010 011100011 011100101 011100110 011100111
011101001 011101010 011101011 011101101 011101110 011101111
011110001 011110010 011110011 011110101 011110110 011110111
011111001 011111010 011111011 011111101 011111110 011111111
100000011 100000110 100000111 100001001 100001011 100001101
100001110 100001111 100010010 100010011 100010110 100010111
100011001 100011010 100011011 100011101 100011110 100011111
100100001 100100011 100100101 100100110 100100111 100101001
100101011 100101101 100101110 100101111 100110001 100110010
100110011 100110101 100110110 100110111 100111001 100111010
100111011 100111101 100111110 100111111 101000001 101000011
101000110 101000111 101001001 101001010 101001011 101001101
101001110 101001111 101010010 101010011 101010110 101010111
101011001 101011010 101011011 101011101 101011110 101011111
101100001 101100010 101100011 101100101 101100110 101100111
101101001 101101010 101101011 101101101 101101110 101101111
101110001 101110010 101110011 101110101 101110110 101110111
101111001 101111010 101111011 101111101 101111110 101111111
110000001 110000011 110000101 110000110 110000111 110001001
110001011 110001101 110001111 110010001 110010010
110010011 110010101 110010110 110010111 110011001 110011010
110011011 110011101 110011110 110011111 110100001 110100011
110100101 110100110 110101001 110101011 110101101
110101110 110101111 110110001 110110010 110110011 110110101
110110110 110110111 110111001 110111010 110111011 110111101
110111110 110111111 111000001 111000010 111000011 111000101
111000110 111001001 111001010 111001011 111001101
111001110 111001111 111010001 111010010 111010011 111010101
111010110 111011001 111011010 111011011 111011101
111011110 111011111 111100001 111100010 111100011 111100101
111100110 111100111 111101001 111101010 111101011 111101101
111101110 111101111 111110001 111110010 111110011 111110101
111110110 111110111 111111001 111111010 111111011 111111101
           111111110 111111111
```

Figure 4:
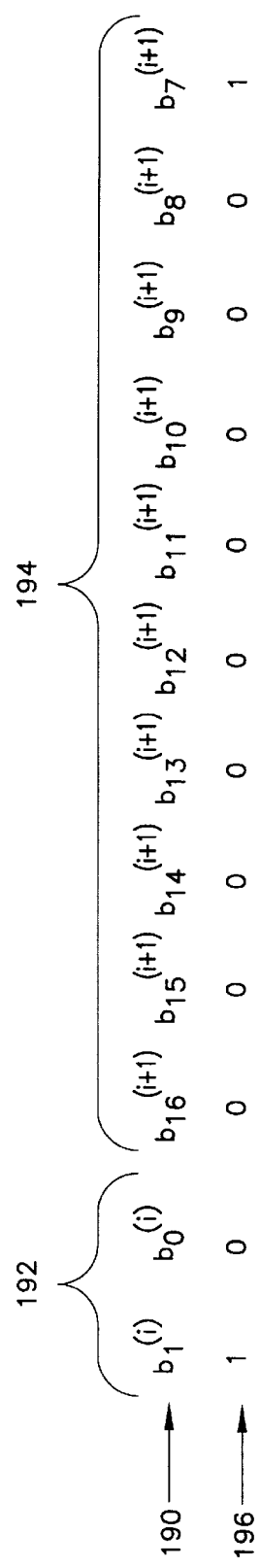
FIG. 4 is a diagram showing an example of the longest possible global stream of consecutive zeroes in adjacent bit positions at a code word output of the encoder shown in FIG. 3.

Of these 260 9-bit code word patterns, 256 patterns are selected to map to corresponding 8-bit user data bytes. With the above-properties, the overall stream of 17-bit code words satisfies the g=10 and i=10 code constraints. FIG. 4 is a diagram showing an example of the longest possible global stream of consecutive zeroes at code word output 182. Row 190 shows bits $b_1^{(i)}$ and $b_0^{(i)}$ of a code word 192 concatenated with bits $b_{16}^{(i+1)}$, $b_{15}^{(i+1)}$, $b_{14}^{(i+1)}$, ... $b_8^{(i+1)}$ and $b_7^{(i+1)}$ of a code word 194. Row 196 shows the bit value of each of the bits $b_1^{(i)}$, $b_0^{(i)}$, $b_{16}^{(i+1)}$, $b_{15}^{(i+1)}$, $b_{14}^{(i+1)}$, ... $b_8^{(i+1)}$ and $b_7^{(i+1)}$. The longest possible global stream of consecutive zeroes at code word output 182 is ten since $b_1^{(i)}$ and $b_0^{(i)}$ are required to be non-zero and since $b_8^{(i+1)}$ and $b_7^{(i+1)}$ are required to be non-zero according to constraints i) and ii) above.

Figure 5:
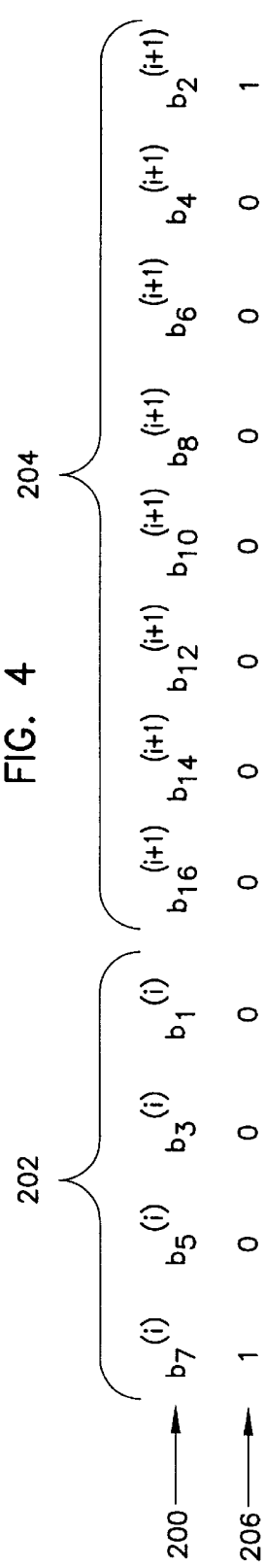
FIG. 5 is a diagram showing an example of the longest possible global stream of consecutive zeroes in even indexed bit positions at the code word output.

FIG. 5 is a diagram showing an example of the longest substream of consecutive zeroes in the even index bit positions at code word output 182. Row 200 shows bits $b_7^{(i)}$, $b_5^{(i)}$, $b_3^{(i)}$ and $b_1^{(i)}$ of a code word 202 concatenated with bits $b_{16}^{(i+1)}$, $b_{14}^{(i+1)}$, $b_{12}^{(i+1)}$, $b_{10}^{(i+1)}$, $b_8^{(i+1)}$, $b_6^{(i+1)}$, $b_6^{(i+1)}$, $b_4^{(i+1)}$ and $b_2^{(i+1)}$ of a code word 204. Row 206 shows the bit value of each of the bits. The longest possible interleaved stream of consecutive zeroes in the even index bit positions is ten since $b_7^{(i)}$, $b_5^{(i)}$, $b_3^{(i)}$ and $b_1^{(i)}$ are required to be non-zero according to constraint iv) above and since $b_8^{(i+1)}$, $b_6^{(i+1)}$, $b_4^{(i+1)}$ and $b_2^{(i+1)}$ are required to be non-zero according to constraint iii) above.

Figure 6:
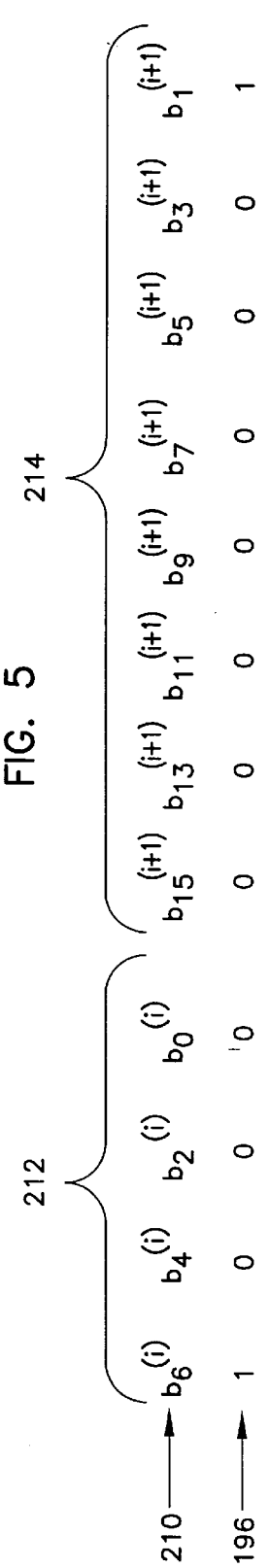
FIG. 6 is a diagram showing an example of the longest possible global stream of consecutive zeroes in odd indexed bit positions at the code word output.

FIG. 6 is a diagram showing an example of the longest substream of consecutive zeroes in the odd index bit positions at code word output 182. Row 210 shows bits $b_6^{(i)}$, $b_4^{(i)}$, $b_2^{(i)}$ and $b_0^{(i)}$ of a code word 212 concatenated with bits $b_{15}^{(i+1)}$, $b_{13}^{(i+1)}$, $b_{11}^{(i+1)}$, $b_9^{(i+1)}$, $b_7^{(i+1)}$, $b_5^{(i+1)}$, $b_3^{(i+1)}$ and $b_1^{(i+1)}$ of a code word 214. Row 216 shows the bit value of each of the bits. The longest possible interleaved stream of consecutive zeroes in the odd index bit positions is ten since $b_6^{(i)}$, $b_4^{(i)}$, $b_2^{(i)}$ and $b_0^{(i)}$ are required to be non-zero according to constraint v) above and since $b_7^{(i+1)}$, $b_5^{(i+1)}$, $b_3^{(i+1)}$ and $b_1^{(i+1)}$ are required to be non-zero according to constraint iv) above.

Table 2 is a listing of encode and decode programs in the C programming language, for example, for encoder 150 and decoder 168, which can be used to implement one embodiment of the present invention. Decoder 168 is similar to encoder 150 shown in FIG. 3, but operates in reverse of encoder 150. Decoder 168 applies the first eight bits B[16:9] of each code word unchanged to the first eight bits U[7:0] of each user data word and maps the second nine bits B[8:0] of each code word into the second eight bits V[7:0] of each user data word according to the inverse of the code mapping used by encoder 150.

TABLE 2

```
#include <stdio.h>
/* Look up table for the encoder */
long enc89er[256] = {
133, 134, 135, 141, 142, 143, 145, 146, 147, 149, 150, 151, 153, 154, 155, 157,
158, 159, 165, 166, 167, 173, 174, 175, 177, 178, 179, 181, 182, 183, 185, 186,
187, 189, 190, 191, 193, 194, 195, 197, 198, 199, 201, 202, 203, 205, 206, 207,
209, 210, 211, 213, 214, 215, 217, 218, 219, 221, 222, 223, 225, 226, 227, 229,
230, 231, 233, 234, 235, 237, 238, 239, 241, 242, 243, 245, 246, 247, 249, 250,
251, 253, 254, 255, 262, 263, 265, 267, 269, 270, 271, 274, 275, 278, 279, 281,
282, 283, 285, 286, 287, 289, 291, 293, 294, 295, 297, 299, 301, 302, 303, 305,
306, 307, 309, 310, 311, 313, 314, 315, 317, 318, 319, 322, 323, 326, 327, 329,
330, 331, 333, 334, 335, 338, 339, 342, 343, 345, 346, 347, 349, 350, 351, 353,
```

TABLE 2-continued

```
    354, 355, 357, 358, 359, 361, 362, 363, 365, 366, 367, 369, 370, 371, 373, 374,
    375, 377, 378, 379, 381, 382, 383, 389, 390, 391, 393, 395, 397, 398, 399, 401,
    402, 403, 405, 406, 407, 409, 410, 411, 413, 414, 415, 417, 419, 421, 422, 423,
    425, 427, 429, 430, 431, 433, 434, 435, 437, 438, 439, 441, 442, 443, 445, 446,
    447, 449, 450, 451, 453, 454, 455, 457, 458, 459, 461, 462, 463, 465, 466, 467,
    469, 470, 471, 473, 474, 475, 477, 478, 479, 481, 482, 483, 485, 486, 487, 489,
    490, 491, 493, 494, 495, 497, 498, 499, 501, 502, 503, 505, 506, 507, 509, 510
    };
/* Look up table for the decoder */
long dec89er[512] = {
    -1,   -1,   -1,   -1, -1,   -1,   -1,   -1,
    -1,   -1,   -1,   -1, -1,   -1,   -1,   -1,
    -1,   -1,   -1,   -1, -1,   -1,   -1,   -1,
    -1,   -1,   -1,   -1, -1,   -1,   -1,   -1,
    -1,   -1,   -1,   -1, -1,   -1,   -1,   -1,
    -1,   -1,   -1,   -1, -1,   -1,   -1,   -1,
    -1,   -1,   -1,   -1, -1,   -1,   -1,   -1,
    -1,   -1,   -1,   -1, -1,   -1,   -1,   -1,
    -1,   -1,   -1,   -1, -1,   -1,   -1,   -1,
    -1,   -1,   -1,   -1, -1,   -1,   -1,   -1,
    -1,   -1,   -1,   -1, -1,   -1,   -1,   -1,
    -1,   -1,   -1,   -1, -1,   -1,   -1,   -1,
    -1,   -1,   -1,   -1, -1,   -1,   -1,   -1,
    -1,   -1,   -1,   -1, -1,   -1,   -1,   -1,
    -1,   -1,   -1,   -1, -1,   -1,   -1,   -1,
    -1,   -1,   -1,   -1, -1,   -1,   -1,   -1,
    -1,   -1,   -1,   -1, -1,    0,    1,    2,
    -1,   -1,   -1,   -1, -1,    3,    4,    5,
    -1,    6,    7,    8, -1,    9,   10,   11,
    -1,   12,   13,   14, -1,   15,   16,   17,
    -1,   -1,   -1,   -1, -1,   18,   19,   20,
    -1,   -1,   -1,   -1, -1,   21,   22,   23,
    -1,   24,   25,   26, -1,   27,   28,   29,
    -1,   30,   31,   32, -1,   33,   34,   35,
    -1,   36,   37,   38, -1,   39,   40,   41,
    -1,   42,   43,   44, -1,   45,   46,   47,
    -1,   48,   49,   50, -1,   51,   52,   53,
    -1,   54,   55,   56, -1,   57,   58,   59,
    -1,   60,   61,   62, -1,   63,   64,   65,
    -1,   66,   67,   68, -1,   69,   70,   71,
    -1,   72,   73,   74, -1,   75,   76,   77,
    -1,   78,   79,   80, -1,   81,   82,   83,
    -1,   -1,   -1,   -1, -1,   -1,   84,   85,
    -1,   86,   -1,   87, -1,   88,   89,   90,
    -1,   -1,   91,   92, -1,   -1,   93,   94,
    -1,   95,   96,   97, -1,   98,   99,  100,
    -1,  101,   -1,  102, -1,  103,  104,  105,
    -1,  106,   -1,  107, -1,  108,  109,  110,
    -1,  111,  112,  113, -1,  114,  115,  116,
    -1,  117,  118,  119, -1,  120,  121,  122,
    -1,   -1,  123,  124, -1,   -1,  125,  126,
    -1,  127,  128,  129, -1,  130,  131,  132,
    -1,   -1,  133,  134, -1,   -1,  135,  136,
    -1,  137,  138,  139, -1,  140,  141,  142,
    -1,  143,  144,  145, -1,  146,  147,  148,
    -1,  149,  150,  151, -1,  152,  153,  154,
    -1,  155,  156,  157, -1,  158,  159,  160,
    -1,  161,  162,  163, -1,  164,  165,  166,
    -1,   -1,   -1,   -1, -1,  167,  168,  169,
    -1,  170,   -1,  171, -1,  172,  173,  174,
    -1,  175,  176,  177, -1,  178,  179,  180,
    -1,  181,  182,  183, -1,  184,  185,  186,
    -1,  187,   -1,  188, -1,  189,  190,  191,
    -1,  192,   -1,  193, -1,  194,  195,  196,
    -1,  197,  198,  199, -1,  200,  201,  202,
    -1,  203,  204,  205, -1,  206,  207,  208,
    -1,  209,  210,  211, -1,  212,  213,  214,
    -1,  215,  216,  217, -1,  218,  219,  220,
    -1,  221,  222,  223, -1,  224,  225,  226,
    -1,  227,  228,  229, -1,  230,  231,  232,
    -1,  233,  234,  235, -1,  236,  237,  238,
    -1,  239,  240,  241, -1,  242,  243,  244,
    -1,  245,  246,  247, -1,  248,  249,  250,
    -1,  251,  252,  253, -1,  254,  255,   -1,
    };
/* ===
    Functions which calculate the 17 bit encoded codeword
    Functions which calculate the 16 bit decoded codeword
=== */
```

TABLE 2-continued

```
#define ENC1617(encin) ((((encin) & 0xff00) << 1) | enc89er[(encin) & 0xff])
#define DEC1716(decin) ((((decin) & 0x1fe00) >> 1) | dec89er[(decin) & 0x1ff])
main ( )
    {
        long data, coded, decoded;
/* === Loop through all possible combinations === */
        for (data = 0; data < 65536; data++) {
            coded = ENC1617(data);
            decoded = DEC1716(coded);
/* === Check if decoded is the same as inputted === */
            if (decoded != data) {
                fprintf(stderr, "error in encode-decode\n");
                exit(1);
            }
        }
    }
}
```

The variables in Table 2 are decimal numbers representing 8-bit user data bytes and 9-bit code words. The first array in Table 2, labeled "long enc89er[256]" maps each data byte from 0 to 256 into one of 256 9-bit code words. For example, a user data byte of "0" maps into the code word "133" as shown in the first location in the encoder array. A user data byte of "1" maps into the code word "134" as shown in the second location in the encoder array. This mapping continues up to a user data byte of "255" which maps into the code word "510" as shown in the last, or 256th, location in the encoder array.

The second array in Table 2, labeled "long dec89er[512]" maps each 9-bit code word, from 0 to 512, into a corresponding one of the 256 user data bytes or a "−1" which corresponds to an invalid code word input. Since not all of the 512 possible 9-bit code word patterns are used by encoder 150, the unused code word patterns are invalid and are not mapped into a valid user data byte. For example, a code word of "0" (an unused code word) maps into a "−1" as shown in the first location in the decoder array. A code word of "133" maps into user data byte "0" as shown in the 134th location in the decoder array. This mapping continues up to code word "511" (an invalid code word) which maps into a "−1" as shown in the last, or 512th, location in the decoder array. The order in which the C program maps individual user data bytes into corresponding code words can be varied in alternative embodiments, as long as each user data byte is mapped to one element of the set of 260 code words listed in Table 1 that meets the selected coding constraints, in a one-to-one (injective) mapping.

Well known semiconductor design tools can be used to generate hardware level descriptions of encoder 150 and decoder 168 from the C program. For example, the C program can be translated into a Hardware Description Language (HDL) definition, such as a Verilog definition, for encoder 150 and decoder 168. A synthesis tool can then be used to translate the HDL definition into a netlist of individual semiconductor gates and interconnections between the gates, which can be fabricated.

In summary, one aspect of the present invention provides a method of encoding successive data words 152 for transmission through a channel 160. A first portion U[7:0] of each successive data word 152 is mapped unchanged into a first portion B[16:9] of a corresponding one of the successive code words 153. A second portion V[7:0] of each successive data word 152 is mapped into a second portion B[8:0] of a corresponding one of the code words 153 according to a selected code. The successive code words 153 are concatenated to form an encoded bit stream 196, 206, 216 having a plurality of bit positions. A run length constraint is imposed on the selected code such that the encoded bit stream 196, 206, 216 has a maximum possible run of ten consecutive binary zeroes in adjacent ones of the plurality of bit positions. An interleave constraint is imposed on the selected code such that the encoded bit stream 196, 206, 216 has a maximum possible run of ten consecutive binary zeroes in every other one of the plurality of bit positions.

In one embodiment, the successive data words 152 each include m bits, where m is an integer. The successive code words 153 each include n bits, where n is an integer and n=m+1. A first, p-bit portion, U, of each successive m-bit data word 152 is mapped unchanged into a first, p-bit portion, B, of a corresponding one of the successive n-bit code words 153, where p is an integer. A second, q-bit portion, V, of each successive m-bit data word 152 into a second, q+1 bit portion B' of a corresponding one of the n-bit code words 153 according to the selected code. For example, m=16, n=17, p=8, and q=8.

Another aspect of the present invention provides a method of encoding successive 16-bit data words 152 for transmission through a channel 160. The method includes mapping a first portion U[7:0] of each successive 16-bit data word 152 unchanged into a first portion B[16:9] of a corresponding 17-bit code word 153, and mapping a second portion V[7:0] of each successive 16-bit data word 152 into a second portion of the corresponding 17-bit code word 153 according to a selected code. The corresponding 17-bit code words 153 for the successive 16-bit data words 152 are concatenated to form a encoded bit stream having a plurality of bit positions. A run length constraint is imposed on the selected code such that the encoded bit stream has a maximum possible run of ten consecutive binary zeroes in adjacent ones of the plurality of bit positions. An interleave constraint is imposed on the selected code such that the encoded bit stream has a maximum possible run of ten consecutive binary zeroes in every other one of the plurality of bit positions.

Another aspect of the present invention provides an encoder 150 for encoding successive data words 152 into respective, successive code words 153 which are concatenated to form an encoded bit stream. The encoder 150 includes an m-bit data word input 180, an n-bit code word output 182 and an encoding circuit 184 coupled between the m-bit data word input 180 and the n-bit code word output 182. The m-bit data word input 180 receives the successive data words 152. The encoding circuit passes a first portion U[7:0] of each successive data word 152 unchanged to the n-bit code word output 182 as a first portion B[16:9] of a respective one of precoder input sequence 153. The encoding circuit 184 passes a second portion V[7:0] of each successive data word 152 to the n-bit code word output 182 as a second portion B[8:0] of the respective precoder input sequence 153 in an encoded form. The encoded form limits the number of consecutive zeroes appearing in the encoded bit stream to a maximum of ten in a sequence of adjacent bit positions within the encoded bit stream and in subsequences of even and odd indexed bit positions in the encoded bit stream.

Yet another aspect of the present invention provides a disc drive storage channel 160. The storage channel includes a transducer 110 capable of communicating with a data storage disc 106 and an encoder 150 coupled to the transducer 110. The encoder 150 encodes successive data words 152 into successive code words 153 according to a selected code to form an encoded bit stream, which is then precoded and applied the transducer 110. The encoder 150 imposes a first consecutive same symbol run constraint on a first length of adjacent bit positions in the encoded bit stream and a second consecutive same symbol run constraint on a second length of even indexed bit positions and odd indexed bit positions in the encoded bit stream.

It is to be understood that even though numerous characteristics and advantages of various embodiments of the present invention have been set forth in the foregoing description, together with details of the structure and function of various embodiments of the invention, this disclosure is illustrative only, and changes may be made in detail, especially in matters of structure and arrangement of parts within the principles of the present invention to the full extent indicated by the broad general meaning of the terms in which the appended claims are expressed. For example, the particular elements may vary depending on the particular application for the coding method and apparatus while maintaining substantially the same functionality without departing from the scope and spirit of the present invention. In addition, although the preferred embodiment described herein is directed to a coding system for a disc drive, it will be appreciated by those skilled in the art that the teachings of the present invention can be applied to other systems, like satellite communications or cellular phone systems, without departing from the scope and spirit of the present invention.

What is claimed is:

1. A method of encoding successive data words into successive code words for transmission through a channel, the method comprising steps of:

(a) mapping a first portion of each successive data word unchanged into a contiguous first portion of a corresponding one of the successive code words;

(b) mapping a second portion of each successive data word into a contiguous second portion of a corresponding one of the code words according to a selected code;

(c) concatenating the successive code words to form an encoded bit stream having a plurality of bit positions; and (d) imposing a run length constraint on the selected code such that the encoded bit stream has a maximum possible run of ten consecutive binary zeroes in adjacent ones of the plurality of bit positions and an interleave constraint on the selected code such that the encoded bit stream has a maximum possible run of ten consecutive binary zeroes in subsequences of even and odd indexed bit positions in the encoded bit stream.

2. The method of claim 1 wherein:

the successive data words each include m bits, where m is an integer;

the successive code words each include n bits, where n is an integer and n=m+1;

the mapping step (a) comprises mapping a first, contiguous p-bit portion of each successive m-bit data word unchanged into a first, contiguous p-bit portion of a corresponding one of the successive n-bit code words, where p is an integer; and the mapping step (b) comprises mapping a second, contiguous q-bit portion of each successive m-bit data word into a second, contiguous q+1 bit portion of a corresponding one of the n-bit code words according to the selected code.

3. The method of claim 2 wherein m=16, n=17, p=8, and q=8.

4. A method of encoding successive 16-bit data words for transmission through a channel, the method comprising steps of:

(a) mapping a first portion of each successive 16-bit data word unchanged into a contiguous first portion of a corresponding 17-bit code word;

(b) mapping a second portion of each successive 16-bit data word into a contiguous second portion of the corresponding 17-bit code word according to a selected code;

(c) concatenating the corresponding 17-bit code words for the successive 16-bit data words to form an encoded bit stream having a plurality of bit positions; and (d) imposing a run length constraint on the selected code such that the encoded bit stream has a maximum possible run of ten consecutive binary zeroes in adjacent ones of the plurality of bit positions and an interleave constraint on the selected code such that the encoded bit stream has a maximum possible run of ten consecutive binary zeroes in subsequences of even and odd indexed bit positions in the encoded bit stream.

5. The method of claim 4 wherein:

the mapping step (a) comprises mapping a first contiguous 8-bit portion of each successive 16-bit data word unchanged into a first, contiguous 8-bit portion of the corresponding 17-bit code word; and the mapping step (b) comprises mapping a second, contiguous 8-bit portion of each successive 16-bit data word into a second, contiguous 9-bit portion of the corresponding 17 -bit code word according to the selected code.

6. An encoder for encoding successive data words into respective, successive code words which are concatenated to form an encoded bit stream, the encoder comprising:

an m-bit data word input for receiving the successive data words;

an n-bit code word output; and an encoding circuit coupled between the m-bit data word input and the n-bit code word output, wherein the encoding circuit passes a contiguous first portion of each successive data word unchanged to the n-bit code word output as a contiguous first portion of a respective one of the successive code words and passes a contiguous second portion of each successive data word to the n-bit code word output as a contiguous second portion of the respective successive code word in an encoded form which limits the number of consecutive binary zeroes appearing in the encoded bit stream to a maximum of ten in a sequence of adjacent bit positions within the precoder input sequence and in subsequences of even and odd indexed bit positions in the encoded bit stream.

7. A disc drive storage channel comprising:

a transducer capable of communicating with a data storage disc; and encoding means coupled to the transducer for encoding successive data words into successive code words according to a selected code to form an encoded bit stream, which is then precoded and applied the transducer as a channel input, wherein the encoding means imposes a first consecutive same symbol run constraint on a first length of adjacent bit positions in the encoded bit stream and a second consecutive same symbol run constraint on a second length of even indexed bit positions and odd indexed bit positions in the encoded bit stream.

8. The disc drive storage channel of claim 7 wherein:

the successive data words each comprise 16 bits;

the successive code words each comprise 17 bits;

the first consecutive zero constraint limits the number of consecutive binary zeroes in adjacent bit positions in the encoded bit stream to a maximum of ten; and the second consecutive zero constraint limits the number of consecutive same symbols in the even indexed bit positions and in the odd indexed bit positions in the encoded bit stream to a maximum of ten.

9. The disc drive storage channel of claim 8 wherein the means for receiving and encoding maps a first, contiguous 8-bit portion of each successive 16-bit data word directly into a first, contiguous 8-bit portion of a corresponding one of the successive 17-bit code words and maps a second, contiguous 8-bit portion of each successive 16-bit data word into a second, contiguous 9-bit portion of the corresponding successive 17-bit code word according to a code which imposes the first and second consecutive same symbol run constraints on the encoded bit stream.

10. The disc drive storage channel of claim 7 and further comprising:

decoding means coupled to the transducer for decoding the successive code words received from the transducer into the successive data words according to the selected code.

11. The disc drive storage channel of claim 10 wherein:

the data code words each comprise 16 bits;

the successive code words each comprise 17 bits; and the decoding means maps a first, contiguous 9-bit portion of each successive 17-bit code word directly into a first, contiguous 8-bit portion of a corresponding one of the successive 16-bit data words and maps a second, contiguous 8-bit portion of each successive 17-bit code word into a second, contiguous 8-bit portion of the corresponding successive 16-bit data word according to the code which imposes the first and second consecutive same symbol run constraints on the encoded bit stream.

\* \* \* \* \*

UNITED STATES PATENT AND TRADEMARK OFFICE
CERTIFICATE OF CORRECTION

PATENT NO. : 6,317,856 B1
DATED : November 13, 2001
INVENTOR(S) : Fredrickson et al.

It is certified that error appears in the above-identified patent and that said Letters Patent is hereby corrected as shown below:

Column 2,
Line 36, change "$\{c_0, C_1, C_2, \ldots \}$" to -- $\{c_0, c_1, c_2 \ldots \}$ --.

Column 8,
Line 21, change "$b^{14(i+1)}$" to -- $b_{14}^{(i+1)}$ --.
Line 21, after "$b_6^{(i+1)}$" delete -- $b_6^{(i+1)}$ --.

Column 15,
Line 7, after "applied" insert -- to --.

Signed and Sealed this

Eleventh Day of March, 2003

JAMES E. ROGAN
*Director of the United States Patent and Trademark Office*

UNITED STATES PATENT AND TRADEMARK OFFICE
CERTIFICATE OF CORRECTION

PATENT NO. : 6,317,856 B1
DATED : November 13, 2001
INVENTOR(S) : Fredrickson et al.

It is certified that error appears in the above-identified patent and that said Letters Patent is hereby corrected as shown below:

Column 2,
Line 36, change "$\{c_0, C_1, C_2, \ldots \}$" to -- $\{c_0, c_1, c_2 \ldots \}$ --.

Column 8,
Line 21, change "$b^{14(i+1)}$" to -- $b_{14}^{(i+1)}$ --.
Line 21, after "$b_6^{(i+1)}$" delete -- $b_6^{(i+1)}$ --.

Column 15,
Line 7, after "applied" insert -- to --.

Signed and Sealed this

Twenty-sixth Day of August, 2003

JAMES E. ROGAN
*Director of the United States Patent and Trademark Office*